(12) United States Patent
Scianna et al.

(10) Patent No.: US 7,989,833 B2
(45) Date of Patent: Aug. 2, 2011

(54) SILICON NANOPARTICLE WHITE LIGHT EMITTING DIODE DEVICE

(75) Inventors: Carlo Scianna, Des Plaines, IL (US); Munir H. Nayfeh, Urbana, IL (US); Abdulrahman Al-Muhanna, King Abdulaziz City of Science and Technology (SA)

(73) Assignee: Goeken Group Corp., Naperville, IL (US)

( * ) Notice: Subject to any disclaimer, the term of this patent is extended or adjusted under 35 U.S.C. 154(b) by 354 days.

(21) Appl. No.: 12/354,552

(22) Filed: Jan. 15, 2009
(Under 37 CFR 1.47)

(65) Prior Publication Data
US 2010/0019261 A1   Jan. 28, 2010

Related U.S. Application Data

(60) Provisional application No. 61/021,257, filed on Jan. 15, 2008.

(51) Int. Cl.
*H01L 33/00* (2010.01)
(52) U.S. Cl. ........................................................ 257/98
(58) Field of Classification Search ............ 257/88–103, 257/E33.061
See application file for complete search history.

(56) References Cited

U.S. PATENT DOCUMENTS
2009/0278125 A1* 11/2009 Duan et al. ..................... 257/49
* cited by examiner

*Primary Examiner* — Cuong Q Nguyen
(74) *Attorney, Agent, or Firm* — Barnes & Thornburg LLP

(57) ABSTRACT

Multiple films of red-green-blue (RGB) luminescent silicon nanoparticles are integrated in a cascade configuration as a top coating in an ultraviolet/blue light emitting diode (LED) to convert it to a white LED. The configuration of RGB luminescent silicon nanoparticle films harnesses the short wavelength portion of the light emitted from the UV/blue LED while transmitting efficiently the longer wavelength portion. The configuration also reduces damaging heat and/or ultraviolet effects to both the device and to humans.

8 Claims, 3 Drawing Sheets

SILICON NANOPARTICLE WHITE LIGHT EMITTING DIODE DEVICE

CROSS REFERENCE TO RELATED APPLICATIONS

The present application claims priority to U.S. Provisional Patent Application Ser. No. 61/021,257 filed on Jan. 15, 2008, which is herein incorporated by reference.

BACKGROUND

For the past 150 years, lighting technology has been mainly limited to incandescence and fluorescence. While derivative technologies such as high-intensity discharge (HID) lamps have emerged, none have achieved energy efficiencies exceeding 25%, with incandescent lighting achieving an efficiency of less than 2%. With the advent of commercial light emitting diodes (LEDs) in the 1960s, however, the door was opened for a different and exciting form of lighting technology. Unlike conventional lighting, LEDs consume less electricity and have largely avoided the parasitic by-products of its predecessors, namely heat. Early LEDs were red in color, with yellow and orange variants following soon thereafter. To produce white light, however, a blue LED was needed. In 1993, Shuji Nakamura of Nichia Chemical Industries produced a blue LED using gallium nitride (GaN). With this development, it was now possible to create white light by combining the light of separate LEDs (red, green, and blue), or by creating white LEDs themselves by means of doping.

Solid state lighting (SSL) refers to a type of lighting that utilizes LEDs, organic light-emitting diodes (OLEDs), or polymer light-emitting diodes (PLEDs) as sources of illumination rather than electrical filaments or gas. Unlike traditional lighting, SSL creates visible light with very little heat or parasitic energy dissipation. Additionally, the solid-state nature provides for greater resistance to shock, vibration, and wear, thereby increasing lifespan significantly. SSL has been described by the United States Department of Energy as a pivotal emerging technology that promises to alter lighting in the future. It is the first new lighting technology to emerge in over 40 years and, with its energy efficiencies and cost savings, has the potential to be a very disruptive technology in the marketplace as well.

A single LED can produce only a limited amount of light, and only a single color at a time. To produce the white light necessary for SSL, light spanning the visible spectrum (red, green, and blue) must be generated in correct proportions. To achieve this effect, three approaches may be used for generating white light with LEDs: wavelength conversion, color mixing, and most recently homoepitaxial ZnSe.

Wavelength conversion involves converting some or all of the LED's output into visible wavelengths. There are a number of techniques that may be used for wavelength conversion. One method is to deposit a yellow phosphor on a blue LED. This is considered an inexpensive method for producing white light. Blue light produced by an LED excites a phosphor, which then re-emits yellow light. This balanced mixing of yellow and blue lights results in the appearance of white light.

Wavelength conversion may also be accomplished by providing additional phosphors on a blue LED. This is similar to the process involved with yellow phosphors, except that each excited phosphor re-emits a different color. Similarly, the resulting light is combined with the originating blue light to create white light. The resulting light, however, has a richer and broader wavelength spectrum and produces a higher color-quality light, albeit at an increased cost.

Yet another technique to accomplish wavelength conversion is by using an ultraviolet (UV) LED coated with doped phosphors which, upon excitation, emit light in the red, green and blue wavelengths. The UV light is used to excite the different phosphors, which are doped at measured amounts. The colors are mixed resulting in a white light with the richest and broadest wavelength spectrum.

Another technique for wavelength conversion uses a thin layer of nanocrystal particles, called quantum dots, containing 33 or 34 pairs of atoms, primarily cadmium and selenium, which are coated on top of a blue LED. The blue light excites the quantum dots, resulting in a white light with a wavelength spectrum similar to UV LEDs.

Color mixing involves utilizing multiple colored LEDs in a lamp and adjusting the intensity of each LED to produce white light. For example, the lamp may contain a minimum of two LEDs (blue and yellow), but can also have three (red, blue, and green) or four (red, blue, green, and yellow). As no phosphors are used, there is no energy lost in the conversion process, thereby exhibiting the potential for higher efficiency. The intensity of the LEDs are configured such that the combination of the emitted light results in white light.

Wavelength conversion provides benefits versus color mixing. A SSL device contains many LEDs placed close together in a lamp to amplify their illuminating effects. This is because an individual LED produces only a limited amount of light, thereby limiting its effectiveness as a replacement light source. In the case where white LEDs are utilized in SSL, this is a relatively simple task, as all LEDs are of the same color and can be arranged in any fashion. When using the color-mixing method, however, it is more difficult to generate equivalent brightness when compared to using white LEDs in a similar lamp size. Furthermore, degradation of different LEDs at various times in a color-mixed lamp can lead to an uneven color output. Because of the inherent benefits and greater number of applications for white LED based SSL, most designs focus on utilizing them exclusively.

Currently, there is no SSL available that can be offered as a true replacement for incandescent or fluorescent lamps, even though several manufacturers have gone forward with the introduction of such products. White LEDs produced today are too expensive to be considered affordable, and the lumens produced by the LEDs today are not as bright as traditional lighting. Based on research conducted by the United States Department of Energy (DOE) and the Optoelectronics Industry Development Association (OIDA), it is expected that by the year 2025, SSL will be the preferred method of illumination in homes and offices.

What is apparent to the end user is the low color rendering index (CRI) of current LEDs. The CRI is widely used to measure how accurately a lighting source renders the color of objects. For example, sunlight and incandescent lamps have a CRI of 100, while fluorescent lamps generally have a CRI>75. The current generation of LEDs, which employs mostly blue LED chip and yellow phosphor, has a CRI of about 70, which is much too low for widespread use in lighting, particularly indoor lighting applications. In order for SSL to effectively replace incandescent lamps, more research must be done on developing alternatives to the techniques currently used that address these concerns.

There are several advantages to the use of the nano-silicon converter in a white LED. Silicon nanoparticles play a dual role of UV blockers and down converters of the UV radiation emitted by the LED. Silicon nanoparticles are highly absorbant of the UV with a quantum conversion larger than 50%. In fact, silicon nanoparticles may act as a total UV filter, resulting in a safe light source. The silicon nanoparticles stay cool because they convert the UV radiation to visible light. The silicon nanoparticles are highly photostable under UV excitation giving a long safe working lifetime.

Further, a film comprised of silicon nanoparticles acts an excellent antireflection coating preventing light from going back into the LED housing causing damage due to heating or direct interaction. The silicon nanoparticle film is transparent in the visible allowing the visible light to go through.

The nanoparticles within each color group are identical, allowing the formation of high optical quality films of closely-packed nanoparticles (solid density). This is beneficial because the emission, transmission and losses of wavelength converter depends sensitively on thickness uniformity and composition of the converter on the chip.

The nanoparticles can be functionalized (doped) to shift their luminescence under the same UV source. Producing a Si—C termination on the particles, for example, shift the spectrum to the silicon carbide emission. This may provide means to improve on filling the white spectrum to achieve a high CRI ratio in the upper nineties.

SUMMARY

The white light emitting diode of the present disclosure includes an ultraviolet/blue light emitting diode (LED) and a converter layer disposed upon an active region of the ultraviolet/blue light emitting diode. The converter layer includes a cascade of silicon nanoparticles configured to fluoresce when exposed to light from the ultraviolet/blue light emitting diode such that the combination of wavelengths of light emitted from the ultraviolet/blue light emitting diode and emitted by fluorescence of the converter layer produces white light. The converter layer includes a number of silicon nanoparticle sublayers, wherein each sublayer is configured to emit fluoresced light in a predetermined wavelength range of the visible spectrum.

For example, the converter layer may have a first sublayer of silicon nanoparticles configured to emit fluoresced light having a first wavelength such that the light emitted from the first sublayer is in the red portion of the visible spectrum. The converter layer may also have a second sublayer of silicon nanoparticles configured to emit fluoresced light having a second wavelength such that the light emitted from the second sublayer is in the green portion of the visible spectrum. Additionally, the converter layer may have a third sublayer of silicon nanoparticles configured to emit fluoresced light having a third wavelength such that the light emitted from the third sublayer is in the blue portion of the visible spectrum. The combination of the wavelengths of the emitted light from the first, second, and third sublayers along with the light emitted from the LED producing white light.

The white LED of the present disclosure may also include a dichroic film layer located between the UV/blue LED and the converter layer. The dichroic film allows UV radiation and visible light emitted from the UV/blue LED to pass through while reflecting visible light emitted by the converter layer away from the LED.

The white LED of the present disclosure may be produced by providing a UV/blue LED and providing a converter layer of silicon nanoparticles onto an active surface of the UV/blue light emitting diode. The converter layer is produced by providing a colloidal suspension of silicon nanoparticles in isopropyl alcohol, spreading the colloidal suspension onto the active surface of the LED, and allowing the isopropyl alcohol to evaporate, resulting in a layer of closely-packed nanoparticles. This process may be repeated to produce a number of sublayers.

BRIEF DESCRIPTION OF THE DRAWINGS

The present disclosure will be described hereafter with reference to the attached drawings which are given as a non-limiting example only, in which.

DETAILED DESCRIPTION

Figure 1:
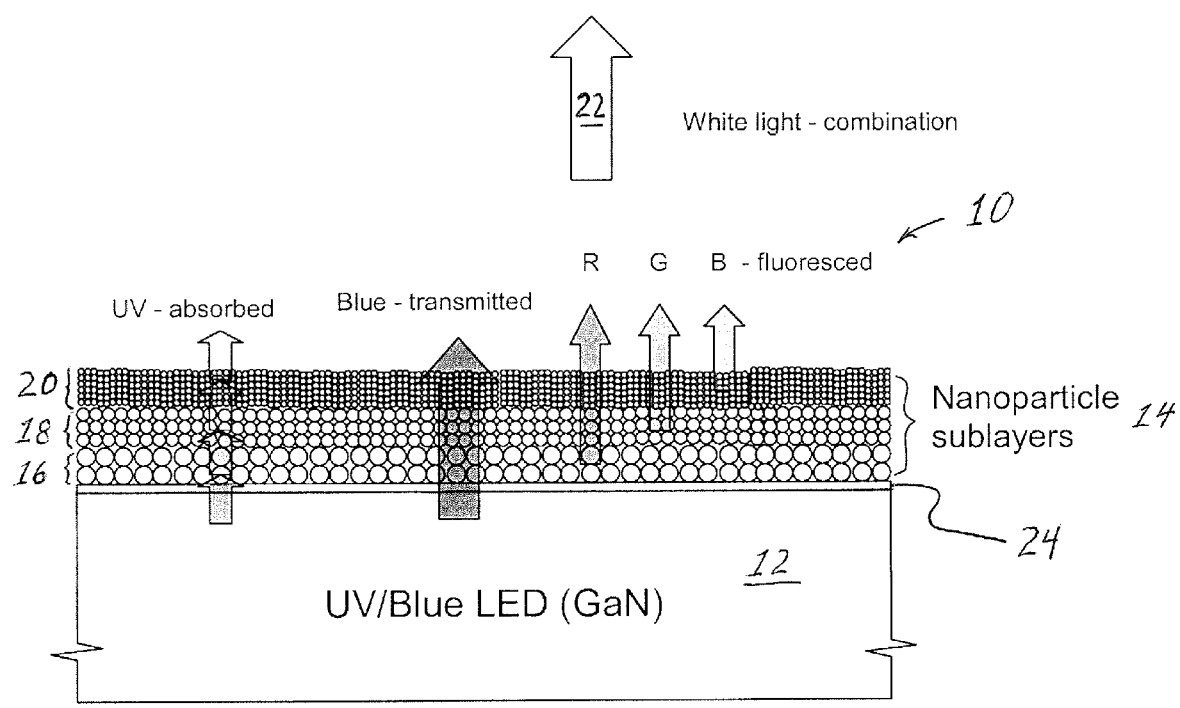
FIG. 1 is a schematic cross-sectional representation of the LED of the present disclosure.
Figure 2:
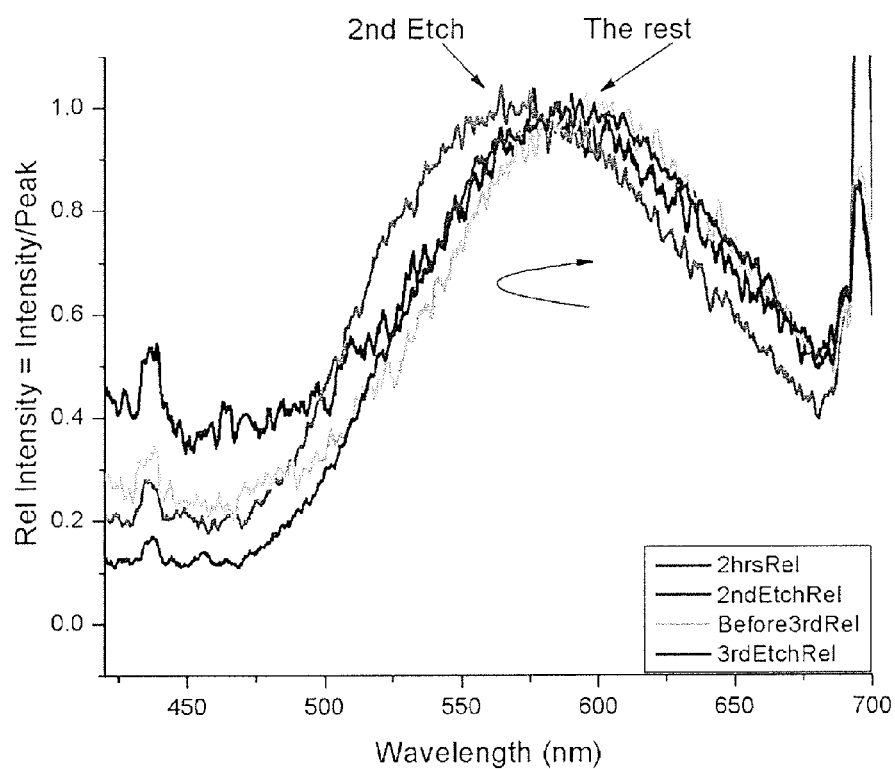
FIGS. 2-5 show the down converted spectrum under UV in the range 330-400 nm of a variety of silicon nanoparticle populations.
Figure 3:
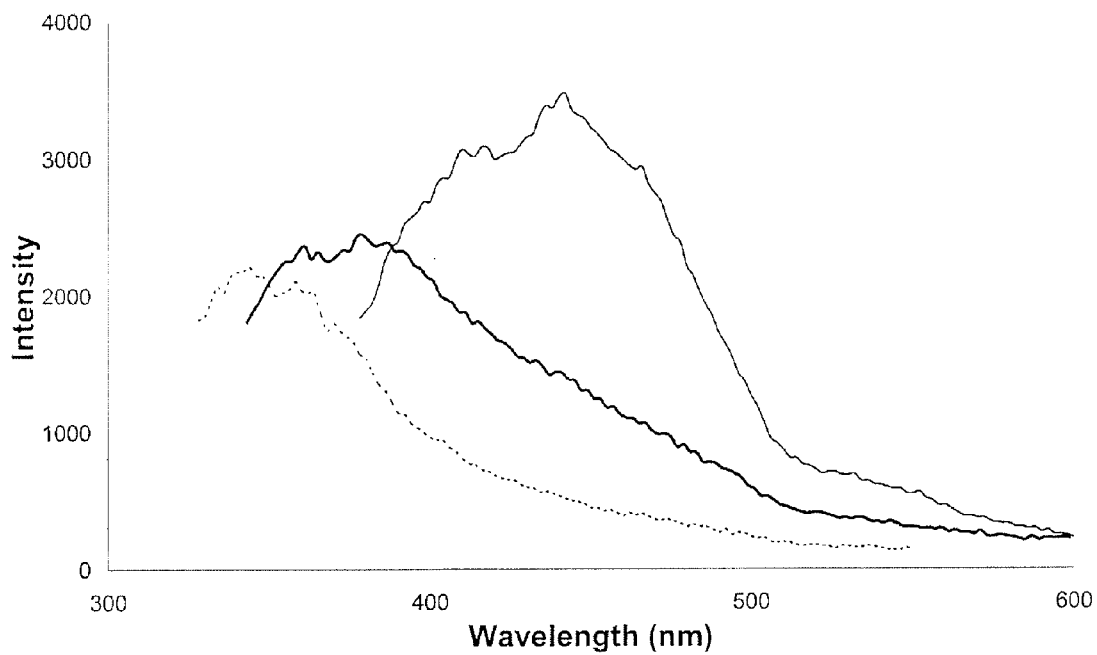
Figure 4:
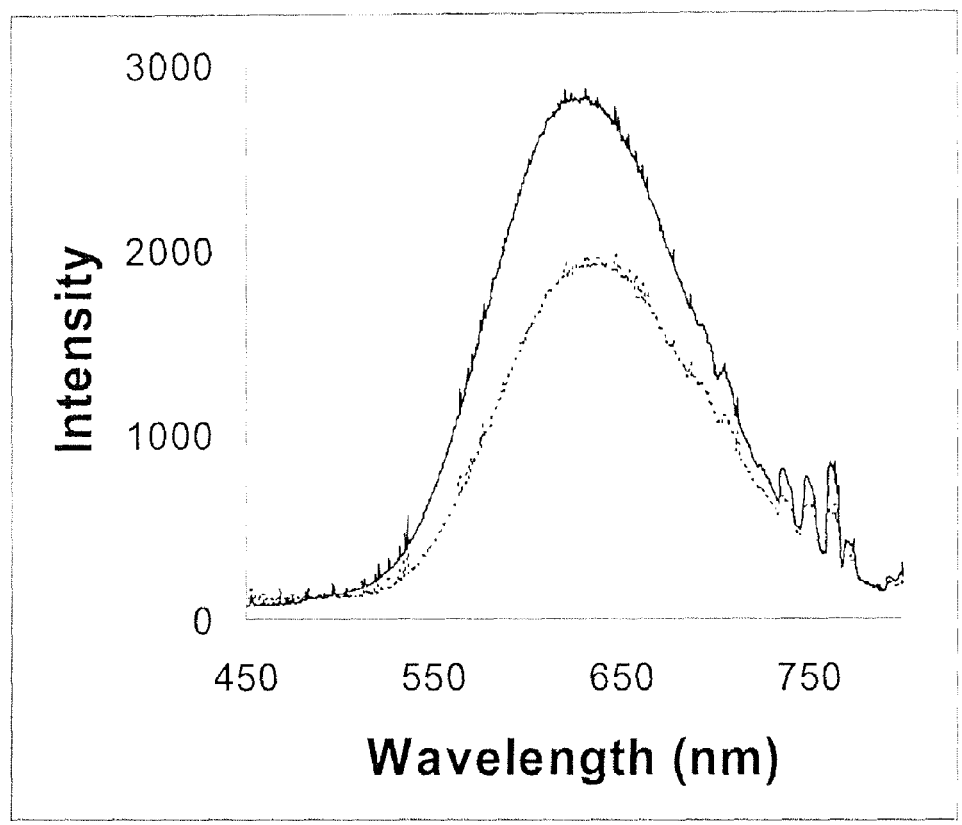
Figure 5:
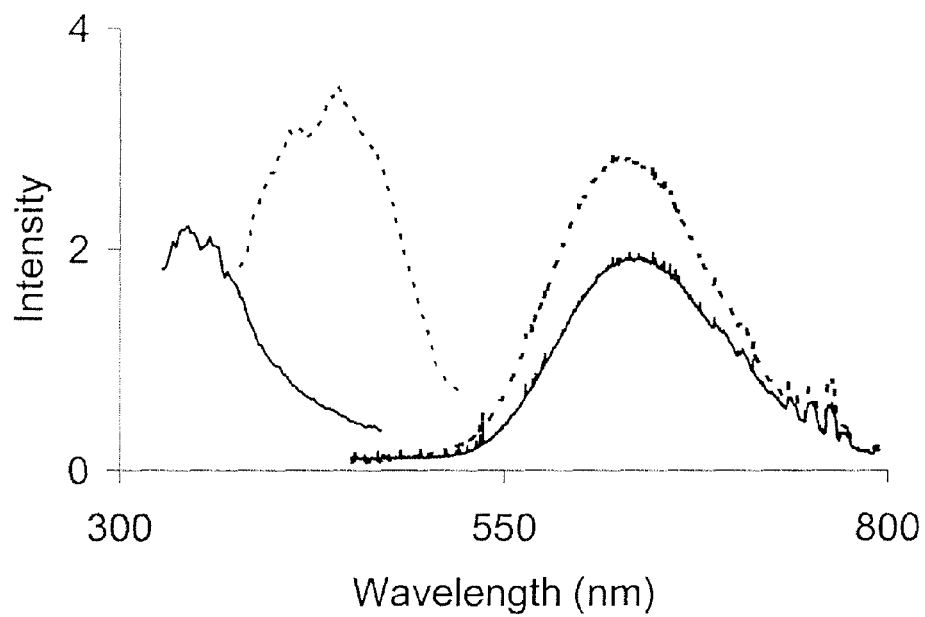

The white light emitting diode (LED) 10 of the present disclosure includes a gallium nitride (GaN) ultraviolet (UV)/blue LED 12 and a wavelength converter 14 disposed on an active region of the UV/blue LED, as shown in FIG. 1. The converter layer 14 includes one or more nanoparticle sublayers 16, 18, 20 in a cascade configuration. The nanoparticles in sublayers 16, 18, and 20 allow blue visible light emitted by the LED to pass through while absorbing the UV radiation emitted by the LED. The absorbed UV radiation excites the nanoparticles which then fluoresce light in wavelengths of the visible spectrum. The nanoparticle sublayers are configured such that wavelengths of fluoresced light combine to produce white light.

In the exemplary embodiment shown, wavelength converter 14 is configured such that each sublayer 16, 18, 20 is tuned to a different section of the spectrum by choice of the size of the nanoparticle, namely red 16, green 18, and blue 20 resulting in a red-green-blue (RGB) wavelength converter. The wavelength converter 14 is configured in a cascade arrangement to produce red light, which is then transmitted through the blue and green layers; green light, which is transmitted through the blue layer; and blue light; the combination being white light 22.

In the exemplary embodiment of FIG. 1, the wavelength converter 14 includes a first sublayer 16 having relatively large silicon nanoparticles tuned to fluoresce light in the red wavelengths of the visible spectrum. Wavelength converter 14 also includes a second sublayer 18 having relatively mid-sized silicon nanoparticles tuned to fluoresce light in the green wavelengths of the visible spectrum. Wavelength converter 14 also includes a third sublayer 20 having relatively small silicon nanoparticles tuned to fluoresce light in the blue wavelengths of the visible spectrum.

FIGS. 2-5 gives the down converted spectrum under UV in the range 330-400 nm of a variety of silicon nanoparticle populations, showing that it is possible to cover the entire visible spectrum of the solar white light (from 400 nm-750 nm) with the device of the present disclosure. In addition, the primary blue component from the GaN LED can be used to further enrich the mixture of emitted light.

The emerging colored light from the sublayers 16, 18, 20 along with some of the remaining LED blue mix together, resulting in a white light with the richest and broadest wavelength spectrum. The thickness of the sublayers are chosen in conjunction with their characteristics absorption/conversion/eye sensitivity to achieve the feel of a sunlight light source.

The white LED of the present disclosure is produced by starting with a gallium nitride (GaN) LED. A colloidal suspension of silicon nanoparticles is prepared in isopropyl alcohol. The active region of the GaN LED is then covered with a layer of silicon nanoparticles by spreading a volume of the particle colloid on the active face. The isopropyl alcohol is allowed to dry under ambient conditions, resulting in the formation of a thin layer of closely packed particles. The response of the GaN LED is measured before the particle layer is formed and after it has been coated. Additional volume of the colloid is then placed on the device and another measurement is taken. This procedure is repeated several times to allow direct correlation of the response with the increase in the thickness of the nanoparticle active layer.

The nanoparticles may also be mixed or functionalized with organic pigments to broaden the color composition. The particles may boost the interaction of UV with the pigment by energy transfer or cascade excitation.

The active nanoparticle sublayers not only improve the conversion of UV radiation to visible light but also act as a filter that protects an end user from the UV radiation emitted from the GaN LED. Also, the nanoparticle film acts as an anti-reflecting coating that stops the UV radiation from reflecting back to the LED, which, if it happens, may cause some damage and shorten the working life of the overall device. Less UV radiation striking back upon the LED device reduces the heat generated in the device and hence prolongs the working life.

In addition to the evaporation-based method for deposit of silicon nanoparticles on the GaN LED, other methods such as spin coating, or electrodeposition may be used. Moreover, alternative methods may be used to dry the nanoparticle colloidal suspension including mild heating and ultraviolet drying, in addition to drying under ambient conditions, as previously described herein.

The down conversion spectra of single silicon nanoparticle color samples in colloids was recorded under irradiation from a 365 nm Hg source. The conversion efficiency of thin films of single color samples was examined under irradiation from a 365 nm Hg source.

Because fluorescence of the silicon nanoparticle sublayers 16, 18, 20 is radiated in all directions equally, half of the response of the particles to the UV irradiation escapes backward, toward the LED. This visible fluoresced light may be reflected away from the LED, and thus increase the visible light output of the white LED of the present disclosure, by using a dichroic thin film 24. This may be done by placing an appropriate coating between the nanoparticles of the wavelength converter 14 and the LED 12, as shown in FIG. 1, which allows UV light to pass through the dichroic film 24 while reflecting the photoluminescence to the outside, away from the LED. Thus efficiency of the LED is further improved by eliminating this loss by redirecting this light outward.

The foregoing is considered as illustrative only of the principles of the claimed invention. Further, since numerous modifications and changes will readily occur to those skilled in the art, it is not desired to limit the claimed invention to the exact construction and operation shown and described, and accordingly, all suitable modifications and equivalents may be resorted to, falling within the scope of the claimed invention.

We claim:

1. A white light emitting diode comprising:
an ultraviolet/blue light emitting diode, and
a converter layer disposed upon an active region of the ultraviolet/blue light emitting diode, the converter layer comprising a cascade of silicon nanoparticles configured to fluoresce when exposed to light from the ultraviolet/blue light emitting diode such that the combination of wavelengths of light emitted from the ultraviolet/blue light emitting diode and emitted by fluorescence of the converter layer produces white light.

2. The white light emitting diode of claim 1 in which the converter layer comprises a plurality of silicon nanoparticle sublayers, wherein each of the plurality of nanoparticle sublayers is configured to emit fluoresced light in a predetermined wavelength range of the visible spectrum.

3. The white light emitting diode of claim 1 in which the converter layer comprises a sublayer of silicon nanoparticles configured to emit fluoresced light having a wavelength such that the light emitted from the sublayer is in the yellow portion of the visible spectrum.

4. The white light emitting diode of claim 2 in which the converter layer further comprises:
a first sublayer of silicon nanoparticles configured to emit fluoresced light having a first wavelength such that the light emitted from the first sublayer is in the red portion of the visible spectrum,
a second sublayer of silicon nanoparticles configured to emit fluoresced light having a second wavelength such that the light emitted from the second sublayer is in the green portion of the visible spectrum, and
a third sublayer of silicon nanoparticles configured to emit fluoresced light having a third wavelength such that the light emitted from the third sublayer is in the blue portion of the visible spectrum.

5. The white light emitting diode of claim 4 in which the converter layer further comprises:
a fourth sublayer of silicon nanoparticles configured to emit fluoresced light having a fourth wavelength such that the light emitted from the fourth sublayer is in the yellow portion of the visible spectrum.

6. The white light emitting diode of claim 1 wherein the converter layer is configured to absorb ultraviolet radiation emitted from the ultraviolet/blue light emitting diode.

7. A white light emitting diode comprising:
a light emitting diode comprised of gallium nitride, and
a converter layer comprised of
a first sublayer of silicon nanoparticles configured to emit fluoresced light having a first wavelength such that the light emitted from the first sublayer is in the red portion of the visible spectrum,
a second sublayer of silicon nanoparticles configured to emit fluoresced light having a second wavelength such that the light emitted from the second sublayer is in the green portion of the visible spectrum, and
a third sublayer of silicon nanoparticles configured to emit fluoresced light having a third wavelength such that the light emitted from the third sublayer is in the blue portion of the visible spectrum
wherein the combination of the fluoresced light emitted from the first sublayer, the second sublayer and the third sublayer produces white light.

8. The white light emitting diode of claim 7 further comprising a dichroic film between the light emitting diode and the converter layer, wherein the dichroic film is configured to allow ultraviolet radiation to pass through away from the light emitting diode, and wherein the dichroic film is configured to reflect visible light fluoresced by the converter layer away from the light emitting diode.

* * * * *